(12) United States Patent
Herrault et al.

(10) Patent No.: US 9,837,372 B1
(45) Date of Patent: Dec. 5, 2017

(54) WAFER-LEVEL DIE TO PACKAGE AND DIE TO DIE INTERCONNECTS SUSPENDED OVER INTEGRATED HEAT SINKS

(71) Applicant: HRL LABORATORIES LLC, Malibu, CA (US)

(72) Inventors: Florian G. Herrault, Agoura Hills, CA (US); Melanie S. Yajima, Los Angeles, CA (US); Alexandros Margomenos, San Jose, CA (US); Miroslav Micovic, Thousand Oaks, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 15/169,591

(22) Filed: May 31, 2016

Related U.S. Application Data (62) Division of application No. 14/720,619, filed on May 22, 2015, now Pat. No. 9,385,083.

(51) Int. Cl.
  *H01L 23/10* (2006.01)
  *H01L 21/00* (2006.01)
  (Continued)

(52) U.S. Cl.
  CPC .......... *H01L 24/70* (2013.01); *H01L 21/0273* (2013.01); *H01L 21/2885* (2013.01); *H01L 21/6835* (2013.01); *H01L 23/3675* (2013.01); *H01L 23/3736* (2013.01); *H01L 24/17* (2013.01); *H01L 24/64* (2013.01); *H01L 24/89* (2013.01); *H01L 25/16* (2013.01);
  (Continued)

(58) Field of Classification Search
  CPC . H01L 23/3736; H01L 23/3675; H01L 24/70; H01L 21/0273; H01L 21/2885; H01L 21/6835; H01L 24/64; H01L 24/89; H01L 25/16; H01L 25/18; H01L 25/50
  See application file for complete search history.

(56) References Cited

U.S. PATENT DOCUMENTS

| 3,681,513 A | 8/1972 | Hargis |
| 4,159,221 A | 6/1979 | Schuessler |

(Continued)

OTHER PUBLICATIONS

U.S. Appl. No. 14/286,923, filed May 23, 2014, Margomenos.
(Continued)

*Primary Examiner* — Alonzo Chambliss
(74) *Attorney, Agent, or Firm* — Ladas & Parry (57) ABSTRACT

An interconnect for electrically coupling pads formed on adjacent chips or on packaging material adjacent the chips, with an electrically conductive heat sink being disposed between the pads, the interconnect comprising a metallic membrane layer disposed between two adjacent pads and disposed or bridging over the electrically conductive heat sink so as to avoid making electrical contact with the electrically conductive heat sink. An electroplated metallic layer is disposed on the metallic membrane layer. Fabrication of interconnect permits multiple interconnects to be formed in parallel using fabrication techniques compatible with wafer level fabrication of the interconnects. The interconnects preferably follow a smooth curve to electrically connect adjacent pads and following that smooth curve they bridge over the intervening electrically conductive heat sink material in a predictable fashion.

18 Claims, 6 Drawing Sheets

(51) Int. Cl.

| | | |
|---|---|---|
| *H05K 7/20* | (2006.01) | |
| *H01L 23/00* | (2006.01) | |
| *H01L 23/367* | (2006.01) | |
| *H01L 21/288* | (2006.01) | |
| *H01L 21/027* | (2006.01) | |
| *H01L 21/683* | (2006.01) | |
| *H01L 25/00* | (2006.01) | |
| *H01L 25/18* | (2006.01) | |
| *H01L 25/16* | (2006.01) | |
| *H01L 23/373* | (2006.01) | |

(52) U.S. Cl.
CPC .............. *H01L 25/18* (2013.01); *H01L 25/50* (2013.01); *H01L 2224/13023* (2013.01); *H01L 2224/13109* (2013.01); *H01L 2224/13111* (2013.01); *H01L 2224/13113* (2013.01); *H01L 2224/13116* (2013.01); *H01L 2224/13139* (2013.01); *H01L 2224/13144* (2013.01); *H01L 2224/13147* (2013.01); *H01L 2224/13155* (2013.01); *H01L 2224/13157* (2013.01); *H01L 2924/014* (2013.01); *H01L 2924/01022* (2013.01); *H01L 2924/01079* (2013.01); *H01L 2924/05042* (2013.01); *H01L 2924/05432* (2013.01); *H01L 2924/06* (2013.01); *H01L 2924/1033* (2013.01); *H01L 2924/10271* (2013.01); *H01L 2924/13064* (2013.01); *H01L 2924/13091* (2013.01)

(56) References Cited

U.S. PATENT DOCUMENTS

| | | |
|---|---|---|
| 5,073,521 A | 12/1991 | Braden |
| 5,198,385 A | 3/1993 | Devitt et al. |
| 5,262,351 A | 11/1993 | Bureau |
| 5,276,455 A | 1/1994 | Fitzsimmons et al. |
| 5,371,404 A | 12/1994 | Juskey |
| 5,583,377 A * | 12/1996 | Higgins, III ............ H01L 23/13 257/706 |
| 5,953,594 A | 9/1999 | Bhatt et al. |
| 6,018,459 A | 1/2000 | Carlson |
| 6,028,367 A | 2/2000 | Yu |
| 6,249,439 B1 | 6/2001 | DeMore et al. |
| 6,900,765 B2 | 5/2005 | Navarro et al. |
| 6,989,592 B2 | 1/2006 | Chang et al. |
| 7,015,060 B1 | 3/2006 | Kubena |
| 7,067,397 B1 | 6/2006 | Chang-Chien |
| 7,271,479 B2 | 9/2007 | Zhao et al. |
| 7,292,381 B1 | 11/2007 | Patterson |
| 7,364,063 B2 | 4/2008 | Schaenzer et al. |
| 7,683,469 B2 | 3/2010 | Oh |
| 7,733,265 B2 | 6/2010 | Margomenos |
| 7,777,315 B2 | 8/2010 | Noquil |
| 7,808,013 B2 | 10/2010 | Mendendorp, Jr. |
| 8,013,434 B2 | 9/2011 | Lin |
| 8,093,690 B2 | 1/2012 | Ko |
| 8,178,963 B2 | 5/2012 | Yang |
| 8,178,964 B2 | 5/2012 | Yang |
| 8,334,592 B2 | 12/2012 | Bhagwagar et al. |
| 8,375,576 B2 | 2/2013 | Kwon |
| 8,617,927 B1 | 12/2013 | Margomenos |
| 8,644,020 B2 | 2/2014 | Lau |
| 8,754,522 B2 | 6/2014 | Meyer |
| 8,759,147 B2 | 6/2014 | Choi |
| 9,040,420 B2 | 5/2015 | Sugiyama et al. |
| 9,059,140 B1 | 6/2015 | Margomenos |
| 9,214,404 B1 | 12/2015 | Margomenos |
| 9,337,124 B1 | 5/2016 | Herrault |
| 9,385,083 B1 | 7/2016 | Herrault |
| 9,508,652 B1 | 11/2016 | Herrault |
| 2003/0006499 A1 | 1/2003 | Choi |
| 2004/0126931 A1 | 7/2004 | Hembree |
| 2005/0077596 A1 | 4/2005 | Bauer |
| 2005/0077614 A1 | 4/2005 | Chengalva et al. |
| 2005/0155752 A1 | 7/2005 | Larson |
| 2006/0027635 A1 | 2/2006 | Schaenzer et al. |
| 2006/0091509 A1 | 5/2006 | Zhao et al. |
| 2006/0157223 A1 | 7/2006 | Gelorme |
| 2006/0292747 A1 | 12/2006 | Loh |
| 2007/0015666 A1 | 1/2007 | Thieme |
| 2007/0075420 A1 | 4/2007 | Lu |
| 2007/0247851 A1 | 10/2007 | Villard |
| 2007/0290326 A1 | 12/2007 | Yang |
| 2008/0099770 A1 | 5/2008 | Mendendorp et al. |
| 2008/0128897 A1 | 6/2008 | Chao |
| 2008/0179725 A1 | 7/2008 | Chia |
| 2008/0298021 A1 | 12/2008 | Ali et al. |
| 2009/0108437 A1 | 4/2009 | Raymond |
| 2009/0134421 A1 | 5/2009 | Negley |
| 2009/0294941 A1 | 12/2009 | Oh et al. |
| 2009/0309209 A1 | 12/2009 | Chen |
| 2010/0140799 A1 | 6/2010 | Do |
| 2010/0283144 A1 | 11/2010 | Liang |
| 2010/0285637 A1 | 11/2010 | Khan |
| 2010/0320588 A1 | 12/2010 | Dahilig |
| 2010/0327465 A1 | 12/2010 | Shen et al. |
| 2011/0049558 A1 | 3/2011 | Lin |
| 2011/0059578 A1* | 3/2011 | Lin ........................ H01L 24/18 438/118 |
| 2011/0291249 A1 | 12/2011 | Chi et al. |
| 2012/0129298 A1 | 5/2012 | Lin |
| 2012/0139095 A1 | 6/2012 | Manusharow |
| 2012/0217627 A1 | 8/2012 | Tseng et al. |
| 2012/0241942 A1 | 9/2012 | Ihara |
| 2012/0276403 A1 | 11/2012 | Nakagawa |
| 2013/0093085 A1 | 4/2013 | Seah |
| 2014/0084445 A1 | 3/2014 | Lin |
| 2014/0332974 A1 | 11/2014 | Schuckman et al. |
| 2015/0007965 A1 | 1/2015 | Joshi |

OTHER PUBLICATIONS

U.S. Appl. No. 14/703,545, filed May 5, 2015, Margomenos.
From U.S. Appl. No. 14/286,923, filed May 23, 2014, unpublished, non publication request filed, Application and Office Actions.
From U.S. Appl. No. 14/703,545 (unpublished, non publication request filed), Office Action mailed on Aug. 3, 2016.
From U.S. Appl. No. 14/703,545 (unpublished, non publication request filed), Office Action mailed on May 24, 2016.
From U.S. Appl. No. 14/703,545 (unpublished, non publication request filed), Office Action mailed on Dec. 15, 2015.
From U.S. Appl. No. 13/306,827 (now published as U.S. Pat. No. 8,617,927), Notice of Allowance mailed on Aug. 15, 2013.
From U.S. Appl. No. 13/306,827 (now published as U.S. Pat. No. 8,617,927), Office Action mailed on Mar. 7, 2013.
From U.S. Appl. No. 13/306,827 (now published as U.S. Pat. No. 8,617,927), Office Action mailed on Jan. 9, 2013.
From U.S. Appl. No. 14/054,572 (now published as U.S. Pat. No. 9,059,140), Notice of Allowance mailed on Feb. 12, 2015.
From U.S. Appl. No. 14/054,572 (now published as U.S. Pat. No. 9,059,140), Office Action mailed on Sep. 19, 2014.
From U.S. Appl. No. 14/054,572 (now published as U.S. Pat. No. 9,059,140), Office Action mailed on Jul. 10, 2014.
From U.S. Appl. No. 14/080,691 (now published as U.S. Pat. No. 9,214,404), Notice of Allowance mailed on Aug. 12, 2015.
From U.S. Appl. No. 14/080,691 (now published as U.S. Pat. No. 9,214,404), Office Action mailed on Apr. 16, 2015.
From U.S. Appl. No. 14/080,691 (now published as U.S. Pat. No. 9,214,404), Office Action mailed on Dec. 17, 2014.
From U.S. Appl. No. 14/720,619 (now published as U.S. Pat. No. 9,385,083), Notice of Allowance mailed on Feb. 24, 2016.
From U.S. Appl. No. 14/720,619 (now published as U.S. Pat. No. 9,385,083), Office Action mailed on Sep. 28, 2015.
Chen, K.C., et al., "Thermal Management and Novel Package Design of High Power Light Emitting Diodes", National Cheng Kung University, Taiwan, Electronic Components and Technology Conference, pp. 795-797, 2008.

(56) References Cited

OTHER PUBLICATIONS

Feeler, R., et al., "Next-Generation Microchannel Coolers", Northrop Grumman Cutting Edge Optronics, vol. 6876, pp. 687608-1-687608-8, Proceedings of SPIE 2008 (8 pages).
Herrault, et al., "Silicon-packaged GaN power HEMTs with integrated heat spreaders," Electronic Components and Technology Conference (ECTC), 2015 IEEE 65.sup.th, Conference: May 26 to May 20, 2015.
Margomenos, A. et al. For "Wafer-Level Packaging Method Incorporating Embedded Thermal Management for GaN-Based RF Front-Ends," IEEE Intersociety Conference on Thermal and Thermomechanical Phenomena in Electronic Systems (ITHERM), May 27-30, 2014 in Orlando, Florida (6 pages).
Final Office Action for related U.S. Appl. No. 14/703,545 dated Oct. 3, 2016 (currently unpublished).
Non-Final Office Action for related U.S. Appl. No. 14/286,923 dated Nov. 1, 2016 (currently unpublished).
U.S. Appl. No. 14/950,667, filed Nov. 2015, Herrault et al.
U.S. Appl. No. 14/532,761, filed Nov. 24, 2015, Herrault.
U.S. Appl. No. 14/950,667, filed Nov. 4, 2014, Herrault.
U.S. Appl. No. 15/299,348, filed Oct. 20, 2016, Herrault.
From U.S. Appl. No. 15/299,348, filed Oct. 20, 2016; unpublished; non publication requested filed, Application and Office Actions.
From U.S. Appl. No. 14/950,667 (now published as U.S. Pat. No. 9,508,652), Notice of Allowance mailed on Aug. 2, 2016.
From U.S. Appl. No. 14/532,761 (now published as U.S. Pat. No. 9,337,124), Notice of Allowance mailed on Jan. 15, 2016.
From U.S. Appl. No. 14/532,761 (now published as U.S. Pat. No. 9,337,124), Office Action mailed on Oct. 6, 2015.
Chang-Chien, P. et al., "MMIC Packaging and Heterogeneous Integration Using Wafer-Scale Assembly," CS Mantech Conference, pp. 143-146, (May 14-17, 2007).
Margomenos A. et al., "Novel Packaging, Cooling and Interconnection Method for GaN High Performance Power Amplifiers and GaN Based RF Front-Ends," Proceedings of the 7th European Microwave Integrated Circuits Conference, pp. 615-618, (Oct. 29-30, 2012).
Margomenos, A. et al., "X-Band Highly Efficient GaN Power Amplifier Utilizing Built-In Electroformed Heat Sinks for Advanced Thermal Management," IEEE International Microwave Symposium, 2013 (4 pages).
Brown, D.F. et al., "High-speed, enhancement-mode GaN power switch with regrown n+ GaN ohmic contacts and staircase field plates," IEEE Electron Device Letters, vol. 34, No. 9, pp. 1118-1120, Sep. 2013.
Ejeckam, F. et al., "Diamond for enhanced GaN device performance," in Proc. IEEE Intersociety Conference on Thermal and Thermomechanical Phenomena in Electronic Systems (ITherm), Orlando, FL, May 27-30, 2014, pp. 1206-1209.
Faqir, M. et al., "Improved thermal management for GaN power electronics: Silver diamond composite packages," Microelectronics Reliability, vol. 52, Issue 12, pp. 3022-3025, 2012.
Margomenos, A. et al., "Wafer-level packaging method incorporating embedded thermal management for GaN- based RF front-ends," in Proc. IEEE Intersociety conference on Thermal and Thermomechanical Phenomena in Electronic Systems (ITHERM), Orlando, FL, May 27-30, 2014, pp. 976-981.
Nochetto, H.C. et al., "GaN HEMT junction temperature dependence on diamond substrate anisotropy and thermal boundary resistance," in Proc. IEEE Compound Semiconductor Integrated Circuit Symposium (CSICS), La Jolla, CA, Oct. 14-17, 2012, pp. 1-4.
Shinohara, K. et al., "Scaling of GaN HEMTs and Schottky diodes for submillimeter-wave MMIC applications," IEEE Trans. Electron Devices, vol. 60, No. 10, pp. 2982-2996, 2013.
From USSN: U.S. Appl. No. 14/286,923 (unpublished; non publication requested), Office Action dated on May 17, 2017.
Woo et al., "Effects of Various Metal Seed Layers on the Surface Morphology and Structural Composition of the Electroplated Copper Layer," Apr. 2009, Metals and Materials International, vol. 15, No. 2, pp. 293-297.

\* cited by examiner

WAFER-LEVEL DIE TO PACKAGE AND DIE TO DIE INTERCONNECTS SUSPENDED OVER INTEGRATED HEAT SINKS

CROSS REFERENCE TO RELATED APPLICATIONS

This application is a division of U.S. Ser. No. 14/720,619 filed May 22, 2015.

STATEMENT REGARDING FEDERALLY SPONSORED RESEARCH OR DEVELOPMENT

This invention was made under US Government contact number FA8650-11-C-7181 and therefore the US Government may have certain rights to this invention.

This application is related to U.S. Pat. No. 8,617,927 which is hereby incorporated herein by reference.

TECHNICAL FIELD

A technology to connect an active circuit die or chip embedded in a thermal heat spreader to other dice or chips or circuit connectors adjacent or near the thermal heat spreader and integrated into a substrate at the wafer level.

BACKGROUND

U.S. Pat. No. 8,617,927 teaches a method of mounting electronic dice or chips into an electroformed heat spreader. Of course, the dice or chips either need to be interconnected with each other or connected to pins or connectors associated with the packaging material used to support or house the the dies or chips and their heat sinks (also called heat spreaders herein).

Wire bonds have been used in the prior art for both connecting contacts on a chip to the packaging it which it resides in use and also for chip to chip connections when multiple chips reside in a single package. Wire bonds, while seemingly small, with the continued tend for smaller and smaller device geometries, the wire bonds now are so large compared with the device geometries of modern integrated chips (ICs) that their size can make it difficult to couple modern ICs either with pins in the packaging in which the ICs reside or with neighboring ICs when multiple ICs are packaged together. This patent introduces a new technology which effectively replaces prior art wirebonding techniques with a new die to package and die to die interconnects which may be conveniently suspended over electrically conductive surfaces such as integrated heat sinks (or heat spreaders) which may be included in the packaging. The new technology is particularly suitable for wafer-level integration and wafer-level processing, which enables parallel interconnection of a multitude of chips at the wafer scale.

U.S. Pat. No. 5,198,385 describes the photolithographic formation of die-to-package airbridge in a semiconductor device, and focuses on single ceramic package integration. Advanced wafer-level packaging technologies that address thermal, electrical, and mechanical performance are now needed to develop low-cost IC packages. This patent introduces a new technology that enables integration of die-to-package and die-to-die interconnects over heat spreaders surrounding the dice, and embedded at the wafer level

BRIEF DESCRIPTION OF THE INVENTION

In one aspect the present invention provides an interconnect for electrically coupling pads formed on adjacent chips or on packaging material adjacent said chips, with an electrically conductive heat sink disposed between said pads, the interconnect comprising: a metallic membrane layer disposed between two adjacent pads and over the electrically conductive heat sink so as to avoid making electrical contact with the electrically conductive heat sink; and an electroplated metallic layer formed on said metallic membrane layer.

In another aspect the present invention provides a method of making an interconnect for electrically coupling pads formed on adjacent chips or on packaging material adjacent said chips, with an electrically conductive heat sink disposed between said pads, the chips, electrically conductive heat sink and the packaging material forming a wafer, the the method comprising: spin coating a photoresist, patterning the photoresist and then reflowing (melting) the patterned photoresist on the wafer so that the spin coated photoresist assumes a desired shape between at least two pads and over the electrically conductive heat sink; and applying and patterning a layer of metal on said wafter so that the layer of metal ohmically connects said pads and bridges over the desired shape of the photoresist.

DETAILED DESCRIPTION

This technology of U.S. Pat. No. 8,617,927 teaches how microelectronic integrated circuits (ICs—also referred to as "chips" and "dice" herein) may be embedded in thermal heat sinks or heat spreaders at the wafer level. This patent application teaches an improved technique for interconnecting at the wafer level either multiple chips and/or for connecting one or more chips to pins associated with wafer packaging material which preferably supports or houses one or more such chips and one or more heat sinks (which also called heat spreaders herein).

Figure 1A:
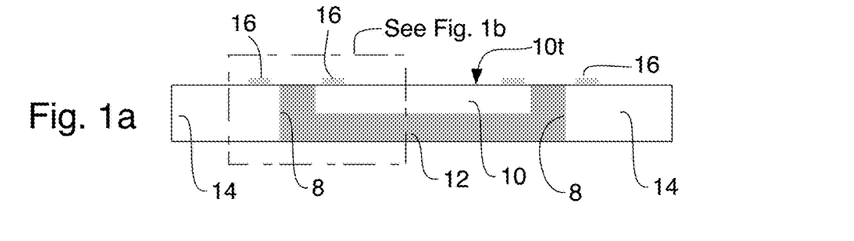
FIGS. 1a-1f depict the fabrication of suspended interconnects in a die-to-package embodiment.
Figure 1B:
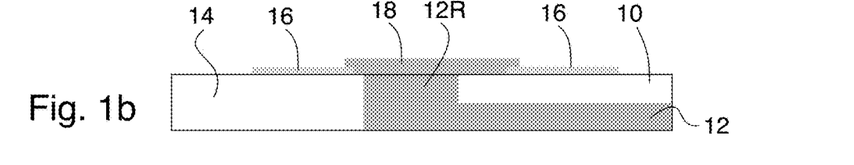
Figure 4:
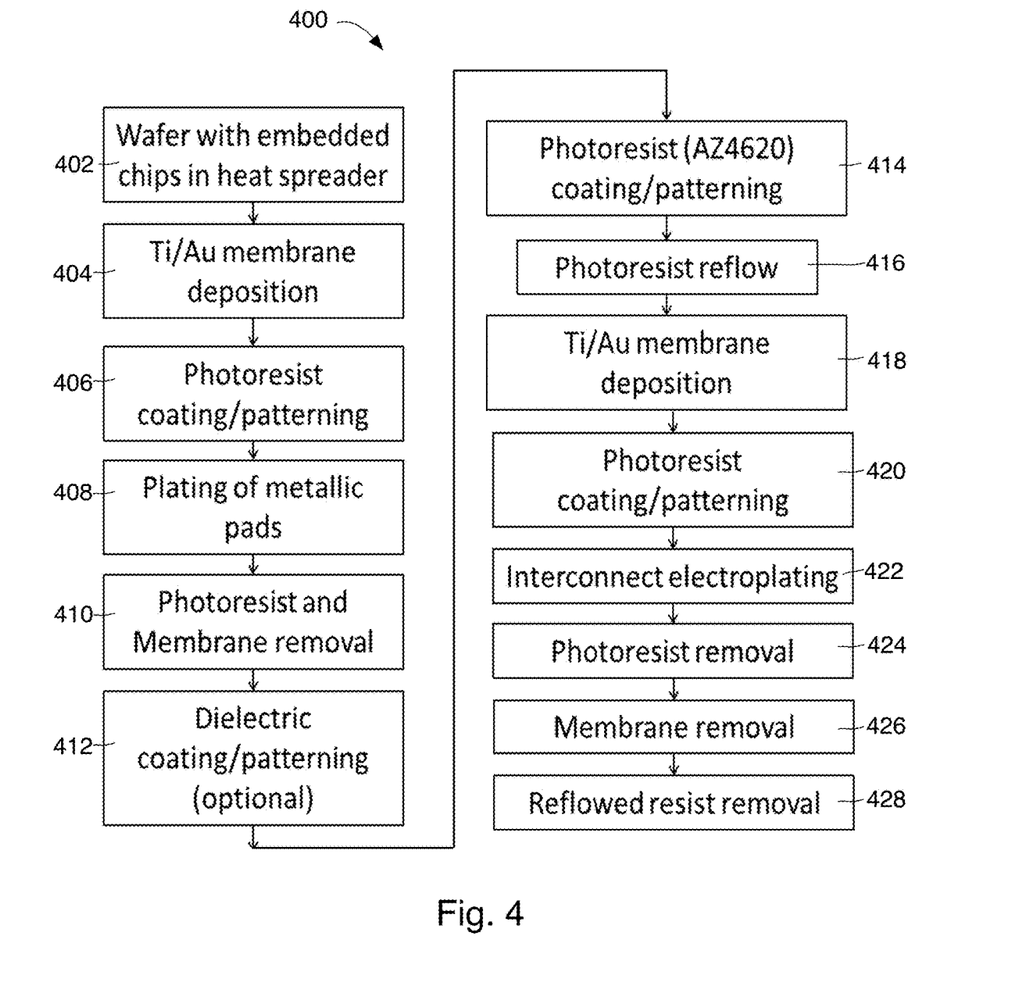
FIG. 4 is a flow chart showing the steps which may be used to make the fabricate suspended interconnects.

FIG. 1a shows an active integrated circuit die or chip 10 embedded in a heat sink or heat spreader 12 which in turn is embedded in wafer packaging material 14. FIG. 1b depicts in greater detail the portion of FIG. 1a within the broken line (and shows, as is discussed below, an initial step utilized in forming a suspended interconnect). FIG. 1c-1f depict additional stages in the fabrication of a suspended die-to-package interconnect. FIG. 4 is a flow chart 400 listing the steps which may be followed for the fabrication of suspended interconnects (for either or both die-to-package or die-to-die interconnects).

In the embodiment of FIG. 1a, the wafer packaging material 14 only supports one chip 10 and one heat spreader 12. However, it should be apparent that the wafer packaging material 14 may support multiple dice or chips 10 with one or more heat spreaders 12 and indeed embodiments with multiple dice or chips 10 with one or more heat spreaders 12 are shown by FIGS. 2a-2c, 3a and 3b. If desired, multiple chips 10 may share a single heat spreader 12. It should also be appreciated that the disclosed method of forming suspended interconnects utilizes wafer-level processing technology and therefore a large number of dice or chips 10 may be embedded more or less simultaneously in wafer packaging material 14 and interconnected with each other or with metallic pads 16 associated with the packaging material 14 using the disclosed method of forming suspended interconnects 26. Conveniently, the suspended interconnects 26 may all be fabricated in parallel in contrast to prior art ball bonding techniques which typically occur sequentially.

The active integrated circuit dice or chips 10 of the embodiments FIG. 1a-1f, 2 or 3a may be GaN chip(s) or may be integrated circuit chips using any other active device technology (MOS, CMOS, Bi-Polar, Si, InP, GaN, SiGe, etc.). Before the die(dice) or chip(s) 10 is(are) mounted as shown by the embodiments of FIG. 1a or 2a-2c or 3a-3b, they are preferably tested so that they are known-good-dice (KGD)—i.e., ICs or chips 10 which are known to be "good" before mounting them.

The heat sink or spreader(s) 12 may be made from Cu (copper), but can be any material having a suitably high thermal conductivity may be utilized (such as CuAl, Cu—CNT, diamond, Au, Ag, etc.) known to those skilled in the art. The heat sink or spreader(s) 12 preferably completely encapsulates the chip(s) 10 from all sides (with the exception of the chip's top or active surface 10t to which connections are be made preferably via metallic pads 16).

The wafer packaging material 14 may be silicon, but other materials such as a liquid crystal polymer (LCP), glass, SiC, that are compatible with microfabrication technologies may be used instead as the wafer packaging material 14. Chip and heat sink integration occurs basically following the general teachings of U.S. Pat. No. 8,617,927, but modified to account for the wafer level processing taught herein. Accordingly, chip-receiving cavities (see numeral 8 in FIG. 1a which point to the sidewalls of a cavity; also see FIGS. 7(a) and 7(b) in Appendix A) in the wafer packaging material 14 are fabricated preferably using conventional micromachining technologies such as deep reactive ion etching of silicon or laser micromachining. The cavities are preferably about 100 microns wider than the dimensions of chip 10, though the integration approach is suitable for (i) cavities that are only 10 microns larger than the chips and (ii) cavities which receive multiple chips integrated near each other in a single cavity. The chips 10 are then bonded face down on a carrier wafer using a high-resolution die bonder, the wafer packaging material 14 is also bonded face down on that carrier. Die bonders can achieve placement accuracy on the order of 1 micron to that the chips 10 on the carrier align with the chip-receiving cavities formed in the wafer packaging material 14. A sputtered membrane layer is then deposited, which can be a Ti/Cu or TaN/Cu membrane, preferably 300 and 3000 Angstroms thick, respectively. The heat spreader is then electroformed through the cavities by copper damascene electroplating. Using this approach, the heat spreader is in intimate contact with the backside of the chips 10, which is highly beneficial for enhanced thermal management. The heat spreader material 12 is subsequently polished down to the surface of the wafer packaging material 14. The wafer 14 with integrated dice 10 and heat spreader 12 is finally released from the carrier, and placed face up, as shown in FIG. 1a. This approach does not necessarily involve any temperature exceeding 100° C., making it compatible with a variety of chip technologies. The structure shown by FIG. 1a has been formed and this corresponds to step 402 of the flow chart 400 of FIG. 4.

Next the metallic pads 16 are microfabricated on the top side(s) 10t of the chip(s) 10 (if needed—the chips may well have suitable metallic pads formed thereon as a part of the chip fabrication process) and on the wafer packaging material 14 preferably using microfabrication techniques (metallic lift-off, or electroplating for example). Preferably the metallic pads 16 are formed by first depositing a Ti/Au membrane which may have a total thickness of about 1200 Angstroms as shown at step 404 of FIG. 4. A photoresist is next applied and patterned as mentioned at step 408 with openings in that photoresist where the pads 16 are to be formed. The openings in the photoresist act as a plating mask through which Au is electroplated, preferably up to a thickness of 5 microns (see step 408), forming the bodies of pads 16. After formation of the pads 16, the photoresist used as a plating mask is removed (preferably using a suitable solvent) and then the exposed Ti/Au membrane is removed (preferably by an ion etch) as is mentioned at step 410.

As shown in FIG. 1b, an optional dielectric layer 18 is applied and patterned (see step 412) so that is it located between the two metallic pads 16 which are to be interconnected. BCB or Benzocyclobutene was selected as the dielectric layer 18 due its low loss tangent properties at high frequencies, and its ease of spin coating and patterning, but other dielectric materials such as $Al_2O_3$, parylene, SiN, spin-on-glass etc may alternatively be utilized as the optional dielectric layer 18. The dielectric layer 18, if utilized, is patterned on top of the heat sink or spreader 12 where the electrically conductive interconnect(s) 26 (see FIG. 10 will eventually bridge over the the heat sink or spreader 12 without the interconnect(s) 26 making ohmic contact with it. As shown in the embodiments of FIGS. 2a-2c, 3a and 3b, the dielectric layer 18 may also (or alternatively) be patterned on top of the heat sink or spreader 12R regions between adjacent chips 10 (or between a chip 10 and the wafer packaging material 14) to facilitate the formation of suspended interconnects 26 between those chips 10 or between a chips 10 and pads 16 on the wafer packaging material 20.

Figure 1C:
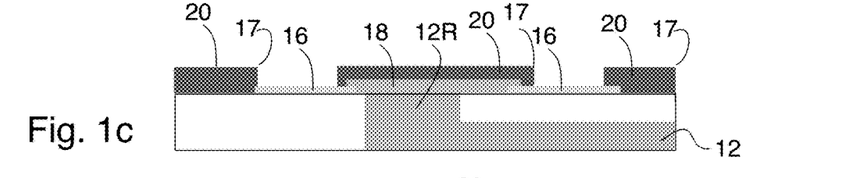
Figure 1D:
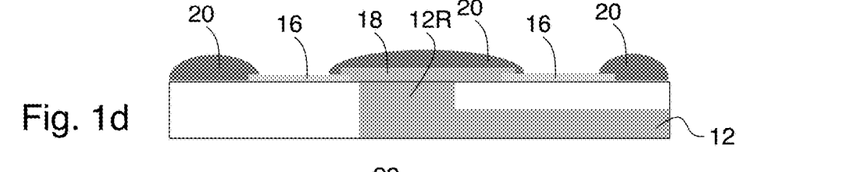
Figure 1E:
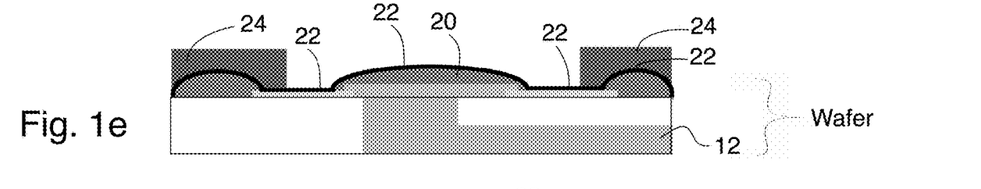
Figure 1F:
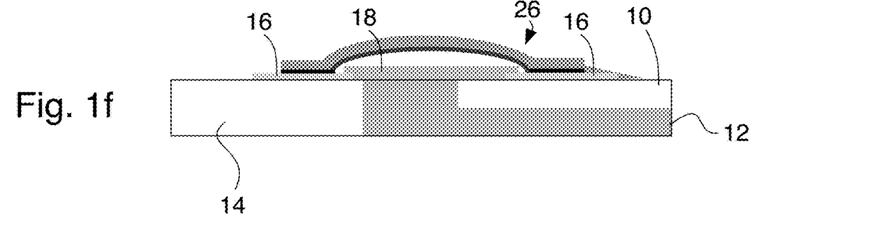

In order to fabricate the suspended die-to-package interconnects 26 (as shown in the embodiment of FIG. 1f) and die-to-die and die-to-package interconnects (as shown in the embodiments of FIGS. 2a-2c, 3a and 3b), a photoresist layer 20 is spin coated on the exposed substrate and then patterned (see step 414). The photoresist layer 20 is preferably a non-cross-linked material such as P4620 made by AZ Electronic Materials of Luxembourg (also available from Microchemicals GmbH of Ulm, Germany as AZ P4620 or AZ 4620) so that it can be heated later and allowed to reflow. When first patterned, the first photoresist layer 20 will have vertical side walls (at its the patterning edges) which meet its horizontal top surface to form 90° edges 17 as shown by FIG. 1c. After patterning, first photoresist layer 20 is allowed to reflow (by heating, for example, to 115° C. for one hour—see step 416), so that the first photoresist layer 20 coalesces into a desired shaped such as a dome or bubble likes shapes (see FIG. 1d) so that the pervious vertical side walls and horizontal top surfaces of the patterned first photoresist layer 20 disappear and the side and top walls preferably assume an essentially continuously rounded dome or bubble shape as depicted by FIG. 1d. The patterned photoresist layer 20 may be also be disposed the top of the wafer packaging material 14 and/or the top of a chip 10 as shown by FIGS. 1c and 1d in addition to being disposed over the heat sink or spreader regions 12R. The photoresist layer 20 is reflowed after photoresist development to form dome-shaped patterns of photoresist 20.

Subsequently as shown in FIG. 1e, a metallic membrane 22, preferably having a thickness on the order of 0.1 to 0.5 micron thick, is applied, preferably by sputtering, onto the exposed upper portion of the wafer. See step 418 of FIG. 4. The material of membrane 22 may be a combination of several metals, and one may typically use a Ti/Au stack, but other metals such as Ti/Cu can also be used. The metallic membrane 22 bridges over the heat sink or spreader 12R regions to adjacent pads 16 and the metallic membrane 22 is supported by the dome shaped of photoresist 20 at this stage. The metallic membrane 22 also makes ohmic contact with adjacent pads 16. A photoresist layer 24 is then applied and patterned (see step 420) on top of the membrane 22 to act as a plating mold 24 for the suspended interconnect(s) 26. Next, the suspended interconnect(s) 26 are formed when metal a metal such as Au or Cu is electroplated at the wafer level on membrane 22 to a thickness about 5 microns or so on the exposed membrane 22. See step 422. The thickness the electroplated material should be at least several times the thickness of membrane 22 so that low resistance and low inductance interconnects 26 are formed. In the embodiment of FIG. 1f, there may be several die-to-package suspended interconnects 26 which formed at the same time (see the embodiments of FIGS. 2a-2c, 3a and 3b). The interconnects 26 may range from 30 to 1000 microns in length, and may be as narrow as 5 microns, but preferably up to about 50 microns, in width and spaced from neighboring interconnects 26 by a spacing of as little as 5 microns. Of course, the lengths, sizes and spacings of the neighboring interconnects 26 may well be dictated by the frequencies of the data signals being passed over those interconnects 26.

For demonstration purposes, Au interconnects 26 were used (see the micro-photographs of FIG. 3b), and one should preferably select the interconnect material so that low loss interconnects will be formed if a metal other than Au is selected for the suspended interconnect 26 material. After electroplating to form interconnects 26, the photoresist layer 24 is developed away (see step 424), followed by a membrane etch (this can be done either by chemical etching, by plasma etching, or by ion milling) to remove the then exposed metallic membrane 22 (see step 426). This etch will also remove some of the suspended interconnect 26 material, but given the thickness of the suspended interconnect 26 material, a slight reduction in its thickness by this etch should not adversely affect it. Of course, additional photoresist could be applied and patterned so the aforementioned membrane etch would have no effect on the thickness of the suspended interconnect 26 material, but that requires additional processing steps which can be avoided by anticipating that the membrane etch will also slightly etch the suspended interconnect 26 material. The membrane etch is then followed by another etch to remove of the reflowed photoresist layer 20 (see step 426), which removal may be performed using a series of solvent soaks. This etch removes the bottom photoresist layer 20 both from underneath the suspended interconnect 26 material and from when it had been under the plating mold 24. A single suspended and electroplated die-to-package interconnect 26 is depicted schematically in FIG. 1f, it being understood that a plurality of interconnects 26 may be formed at the same time following the method described above and the interconnects 26 thus formed may be a mixture of die-to-die interconnects 26 and die-to-package interconnects 26 as depicted, for example, by FIGS. 2a-2c and 3a-3b.

Optional dielectric layer 18 is depicted in the embodiment of FIGS. 1b-1f, but that layer may be omitted if desired.

Figure 2A:
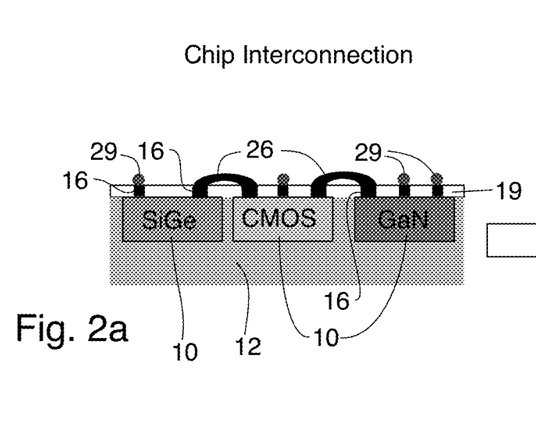
FIGS. 2a-2c depict using the suspended interconnects in both die-to-die (chip-to-chip) and die-to-package (chip-to-package) applications at the wafer level.

FIG. 2a depicts an embodiment where the electroplated interconnects 26 are utilized as die-to-die (chip-to-chip) interconnects. The die-to-die (chip-to-chip) interconnects 26 are preferably made using the steps described above with reference to FIGS. 1a-1e, but those steps are used in the embodiment of FIG. 2a to form metallic connections between the metallic pads 16 which may be microfabricated on the top sides of adjacent chips 10.

Figure 2B:
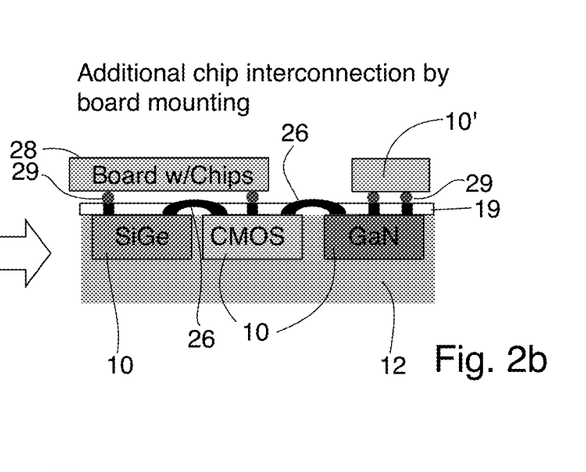

FIG. 2a herein is similar to FIG. 3 of U.S. Pat. No. 8,617,927, but the die-to-die interconnects of U.S. Pat. No. 8,617,927 are replaced with the improved interconnects 26 described herein. So after the interconnects 26 are formed on the structure as depicted by FIG. 2a, then standard bumping technologies 29 (SnCu, SnAg, In, InAu, NiSn, Au, SnPb, SnCo, SnCu, SnAu, InAg, CuIn, SnBi, NiIn, SnAgCu, etc.) may be utilized (if desired) so that other chips (such a chip 10') or boards (with chips) 28 which hold electronics that preferably do not generate significant heat may to bonded to the structure shown in FIG. 2a as is depicted by FIG. 2b. An interface layer 19 may be deposited on the front side of the composite substrate 25 where the active surfaces of the chips 10 were exposed prior to depositing layer 19. The deposition of the interface layer 19 can be done by spinning, lamination, spraying or any other appropriate method of deposition. Examples of materials which may be used as the interface layer 19 are dry etched resins and polymers (BCB, polyimides), photodefinable polymers (BCB, polyimides, SU-8, PMMA), dry film laminates, and conventional printed circuit board laminate layers (epoxy pre-pegs and resin coated Cu layers). The materials in parenthesis are only examples and equivalent materials with similar properties, known to persons skilled in the art, which can be utilized in their place. Pads 16 are omitted in this embodiment of FIG. 2b for die-to-die interconnects 26 since the chips 10 may have suitable pads already formed thereon as a part of the chip manufacturing processes thereby eliminating any need or desire to provide additional pads 16. Pads 16 are shown as being provided with the bumps 29 so that the bumps 29 protrude through layer 19 if such a layer is utilized.

Figure 2C:
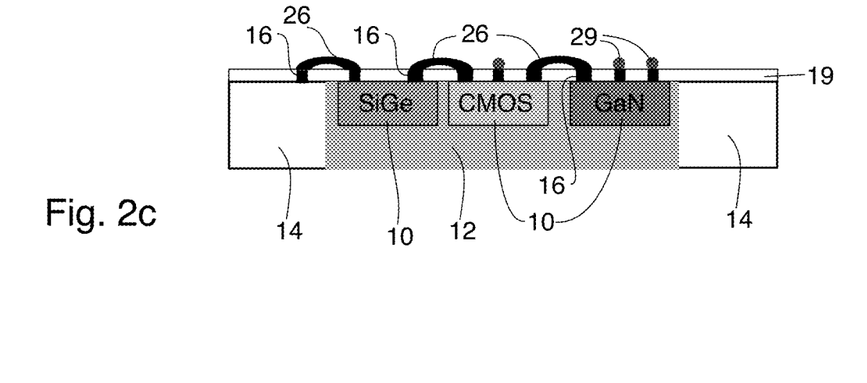

FIG. 2c depicts an embodiment similar to that of FIG. 2a, but in this embodiment the structure of FIG. 2a is embedded by wafer packaging material 14 and a suspended interconnect 26 is shown on the left hand side of this figure between a pad 16 formed on the wafer packaging material 14 and a pad 16 formed on the left hand most chip 10. The material of the packaging 14 may be silicon or another material as is discussed above.

Figure 3A:
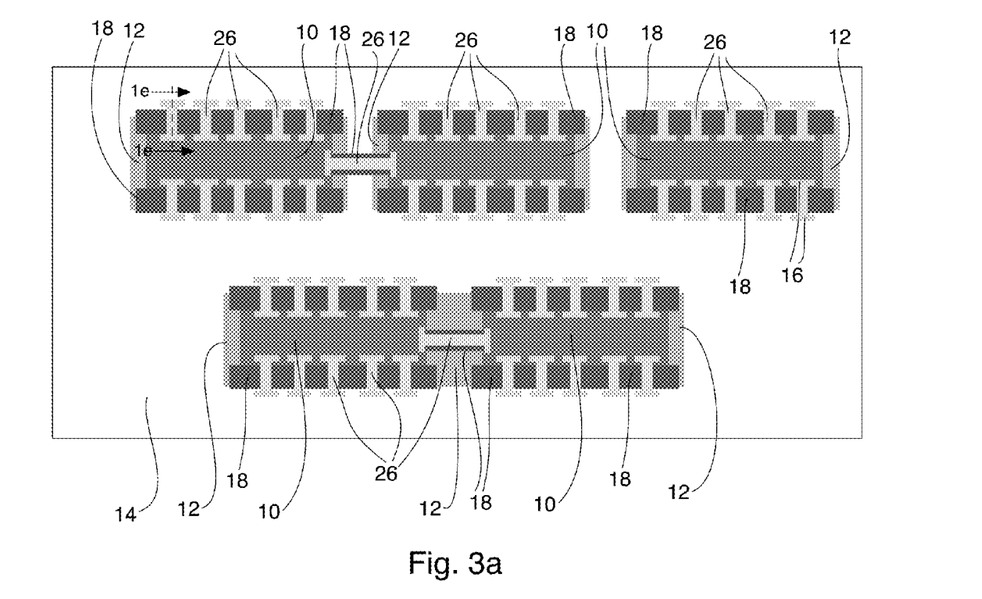
FIG. 3a is a top down view corresponding to multiple instances of the side elevational view of FIG. 1f.

FIG. 3a is a top down view corresponding to multiple instances of the side elevational view of FIG. 1e. A section line for FIG. 1e is only marked once on FIG. 3a for ease of illustration, but each instance of a suspended interconnect 26 between a chip 10 and a pad 16 on packaging material 14 could be so marked. This embodiment demonstrates again the compatibility of this technique with the fabrication of multiple interconnects 26 at the same time through microfabrication technologies. As illustrated, die-to-package over-heat-sink interconnects, die-to-die within-heat-sink and die-to-die over-heat-sink interconnects can be fabricated. As the number of dice and the number of interconnects increase, this technology becomes particularly attractive as a replacement for wire bonding since it features parallel processing, uniformly sized and shaped interconnects which allows for both a low-profile and low-inductance.

In FIG. 3a it should be noted that five chips 10 are depicted. Each chip 10 has ten suspended interconnects 26 on the elongate sides of the chips, each of which suspected interconnect electrically connects a pad 16 on the chip with a pad 16 on the packaging material 14. The chips 10 are encased in heat sink or spreader 12 material, and indeed the two chips depicted at the lower portion of FIG. 3a and encased together in a common heat sink or spreader 12. The suspended interconnects 26 bridge over the heat sink or spreader 12 preferably as shown in FIG. 1e. Some chips 10 utilize suspected interconnects 26 to interconnect them directly as shown in FIG. 2a. Only two such suspected interconnects 26 (between chips 10) are shown for ease of illustration by FIG. 3a, it being understood that many such chip-to-chip suspended interconnects 26 may be utilized between adjacent chips if desired.

Figure 3B:
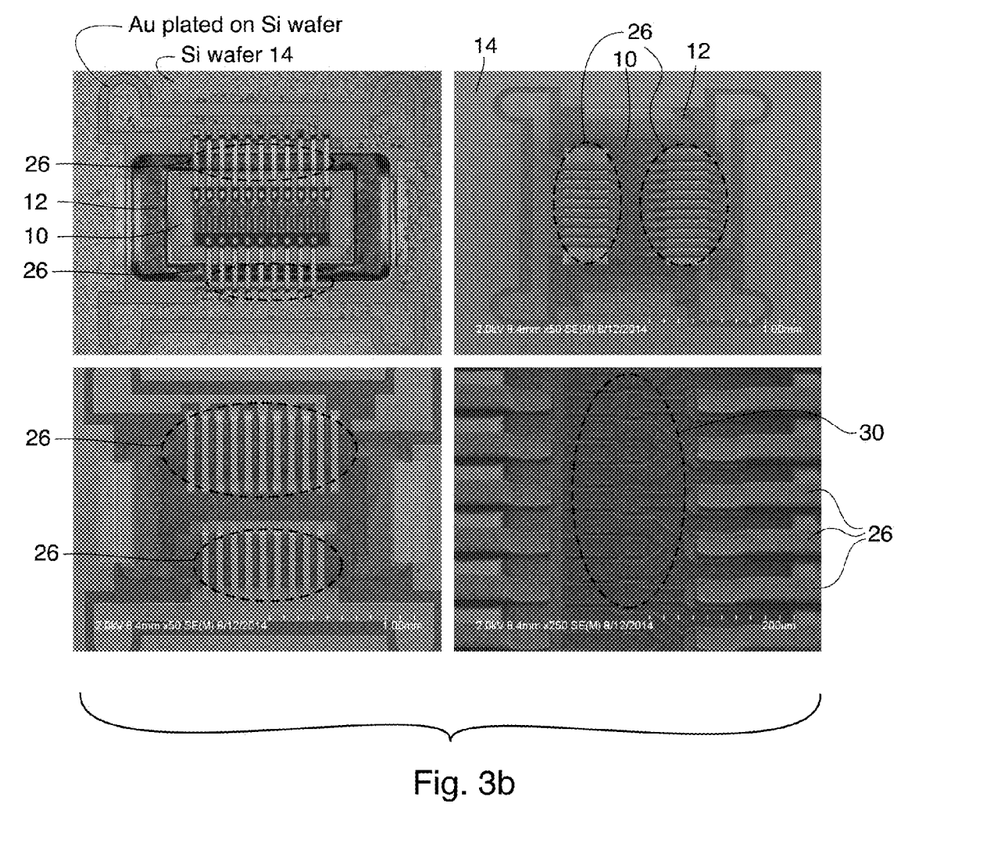
FIG. 3b depicts a microscope image and scanning electron microscope images of suspended and electroplated die-to-package interconnects from a GaN-on-SiC power HEMTs to gold-plated pads on a silicon package wafer.

FIG. 3b shows a microscope image and scanning electron microscope images of suspended and electroplated die-to-package interconnects 26 from a GaN-on-SiC power HEMTs 30 to gold-plated pads on a silicon package wafer 14. These images demonstrate the high-quality of the heat-spreader 12 embedded die 10 with the electroplated interconnects 26 and the silicon package 14. Measurements indicated that the profile of these interconnects is less than 50 microns (which is 3× improvement over traditional wire bonds, which traditional wire bonds greatly affect the process for making fully-packaged devices due to their relatively large sizes compared to the technology disclosed herein), and DC resistance were in agreement with calculated values based on resistivity of electroplated gold conductors.

Figure 5:
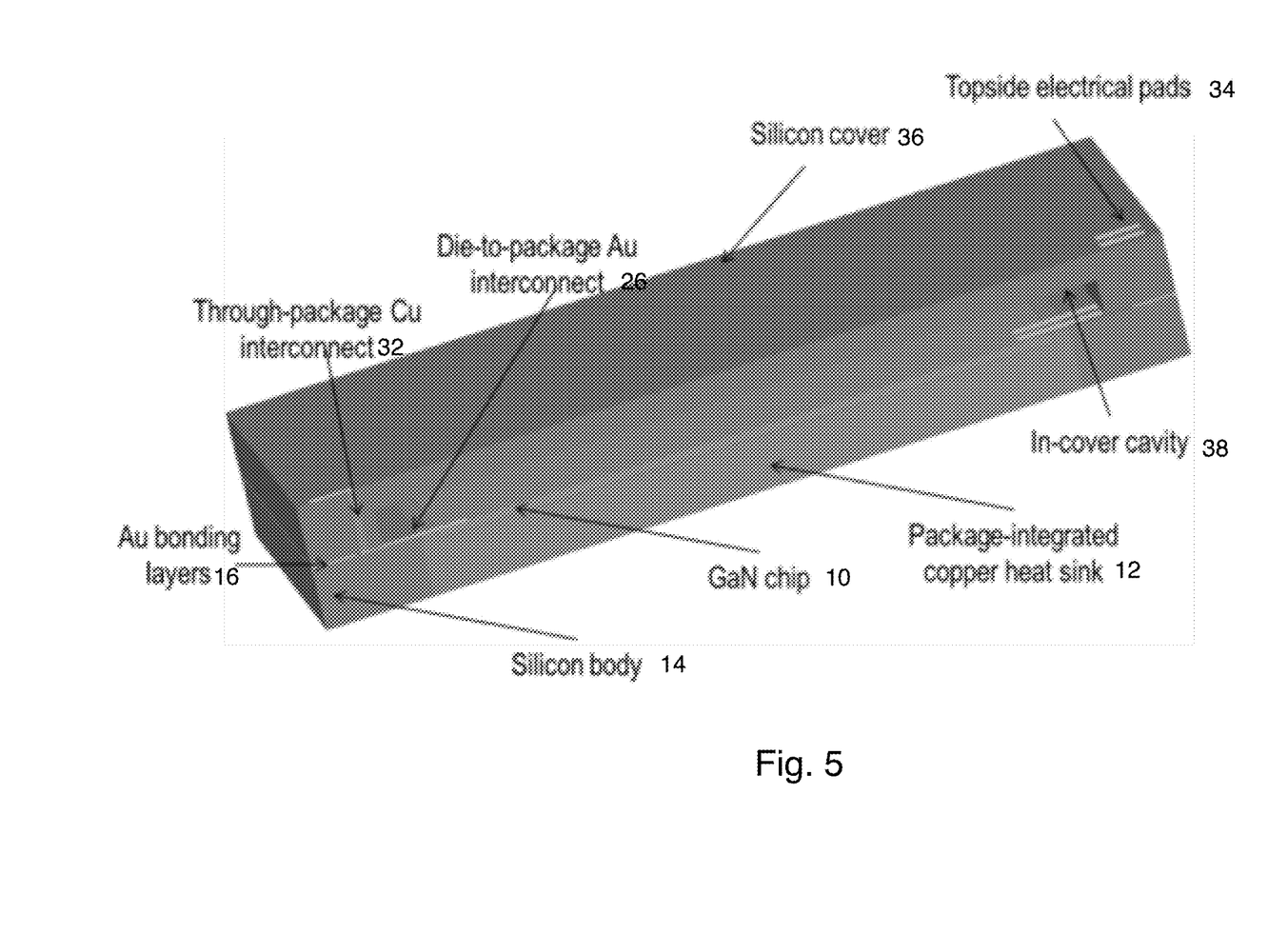
FIG. 5 is cut away perspective view of a hermetically sealed package with an active device embedded in a heat sink, with suspended die-to-package interconnects which bridge over the heat sink and with through-silicon via interconnects for top-side connection between external electrical pads and the active device via the suspended die-to-package interconnects.

FIG. 5 shows a cross-sectional schematic of a wafer-level packaging scheme combining these die-to-package electroplated interconnects 26 with through-silicon metal filled vias 32 for hermetic packaging of active devices (on chip 10). The metal filled vias 32 couple to the pads 16 on the silicon package wafer 14 (the pads 16 may assume a more wire-like configuration as is depicted by FIG. 5) to exterior connections 34 on a cover 36 which may be made of the same material as the packaging material 14, for example, silicon. The cover 36 has a cavity 38 for receiving chip 10. The cover 36 is hermetically bonded to the package wafer 14 preferably by Au to Au hermo-compression bonding in a nitrogen atmosphere. By eliminating the traditional wire bonds from this topology, a much more compact and high-performance wafer-level package can be designed and fabricated.

The suspended interconnects 26 disclosed herein have several advantages compared with traditional wire bonds:

1. Currently, existing die-to-package interconnects rely on wire bonding, which is a serial process. The disclosed process is parallel since it relies on lithography and electroplating allowing a plurality of suspended interconnects 26 to be made concurrently.

2. The disclosed interconnects 26 are suspended, which enables connections without short-circuiting the heat-spreader-embedded die or chip 10 with the heat spreader or sink 12 itself. Additionally, a protective dielectric layer 18 may be deposited over the heat spreader or sink 12 prior to fabrication of the interconnects 26.

3. This wafer-scale suspended interconnect technology is compatible with low-temperature processes (<115° C.) (which are lower than wire bonding which is typically done at >120° C.).

4. The die-to-package interconnect technology disclosed herein is compatible with Though Silicon Via (TSV) integration technology and hermetically-sealed packages.

5. The interconnects preferably follow a smooth curve to electrically connect adjacent pads and following that smooth curve they bridge over the underlying electrically conductive heat sink material in a predictable fashion.

6. Traditional wire bonds have higher resistance and inductance, exhibit higher vertical profile, than do the presently disclosed suspended interconnects, so the presently disclosed suspended interconnects are superior in these regards as well compared to traditional wire bonds.

Additional information regarding the disclosed interconnects 26 and the packaging techniques mentioned herein can be found in the attached Appendix A.

Having described the invention in connection with certain embodiments thereof, modification will now certainly suggest itself to those skilled in the art. As such, the invention is not to be limited to the disclosed embodiments except as is specifically required by the appended claims.

What is claimed is:

1. An interconnect for electrically coupling pads formed on adjacent chips or on packaging material adjacent said chips, with an electrically conductive heat sink disposed between said pads, the interconnect comprising:
   (i) a metallic membrane layer disposed between two pads and over the electrically conductive heat sink so as to avoid making electrical contact with the electrically conductive heat sink; and
   (ii) an electroplated metallic layer formed on said metallic membrane layer.

2. The interconnect of claim 1 wherein the metallic membrane layer is formed of layers of Ti and Au and the electroplated metallic layer is formed of a body of Au which has a thickness which is at least ten times thicker than a thickness of the layers of Ti and Au.

3. The interconnect of claim 1 wherein a plurality of interconnects occur with each of said interconnects having a width which is greater than or equal to a spacing between adjacent ones of the interconnects in said plurality of interconnects.

4. An interconnect for electrically coupling at least one pad formed on an electronic component with at least another pad formed on packaging material adjacent a chip, with an electrically conductive heat sink being disposed between said at least one pad and said at least another pad, the interconnect comprising: a metallic layer disposed between said at least one pad and said at least another pad and over the electrically conductive heat sink so as to avoid making electrical contact with the electrically conductive heat sink, wherein the metallic layer comprises at least first and second layers comprising different metals.

5. The interconnect of claim 4 wherein the metallic layer is formed of thin layers of Ti and Au and a thick body of Au which has a thickness which is at least ten times thicker than a thickness of the layers of Ti and Au.

6. The interconnect of claim 4 wherein said metallic layer takes a continuously rounded dome or bubble like shape between said at least one pad and said at least another pad and over the electrically conductive heat sink.

7. The interconnect of claim 4 wherein said electronic component is a semiconductor chip.

8. The interconnect of claim 4 wherein the first layer includes at least Ti and the second layer includes at least Cu or Au.

9. The interconnect of claim 4 wherein the first layer includes at least Ti and the second layer includes a metal other than Ti.

10. The interconnect of claim 4 wherein the first layer includes at least Ti/Cu or Ti/Au.

11. The interconnect of claim 10 wherein the second layer includes at least Cu or Au.

12. The interconnect of claim 4 wherein the first layer has a first thickness and the second layer has a second thickness, the second thickness being thicker than said first thickness.

13. The interconnect of claim 12 wherein the second thickness is at least ten times thicker than said first thickness.

14. The interconnect of claim 12 wherein the first layer includes at least Ti and the second layer includes at least Cu or Au.

15. The interconnect of claim 14 wherein the first layer includes Ti/Au or Ti/Cu.

16. An arrangement of a plurality of semiconductor chips comprising:
an electrically conductive heat sink in which each of said plurality of semiconductor chips is embedded, each of said plurality of semiconductor chips having a plurality of pads for making, in use, electrical connection with circuits in said semiconductor chips, and
an interconnect for coupling at least one pad on one of said semiconductor chips with at least another pad on another one of said semiconductor chips, the interconnect comprising a metallic layer disposed between said at least one pad and said at least another pad and over a portion of electrically conductive heat sink so as to avoid making electrical contact with the electrically conductive heat sink.

17. The arrangement of claim 16 further including packaging material, the electrically conductive heat sink being at least partially surrounded by said packaging material.

18. The arrangement of claim 17 wherein one or more pads are disposed on said packaging material and further including an interconnect for coupling said at least one pad on one of said semiconductor chips with at least pad on said packaging material, the interconnect including a metallic layer disposed between said at least one pad on one of said semiconductor chips and said at least pad on said packaging material and over a portion of electrically conductive heat sink so as to avoid making electrical contact with the electrically conductive heat sink.

* * * * *